(12) United States Patent
Lubrano-Lavaderci et al.

(10) Patent No.: US 9,861,016 B2
(45) Date of Patent: Jan. 2, 2018

(54) DEVICE FOR ATTENUATING ELECTROMAGNETIC PULSE GENERATED IN A POWER LASER INSTALLATION

(71) Applicant: Commissariat A L'Energie Atomique et aux Energies Alternatives, Paris (FR)

(72) Inventors: Frederic Lubrano-Lavaderci, Lege Cap-Ferret (FR); Mathieu Bardon, Le Teich (FR); Jean-Luc Dubois, Le Barp (FR); Stephanie Champeaux, Breuillet (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 198 days.

(21) Appl. No.: 14/882,768

(22) Filed: Oct. 14, 2015

(65) Prior Publication Data

US 2016/0113158 A1    Apr. 21, 2016

(30) Foreign Application Priority Data

Oct. 16, 2014 (FR) ..................................... 14 59941

(51) Int. Cl.
*H05K 9/00* (2006.01)
*G21K 5/08* (2006.01)
*G21B 1/23* (2006.01)

(52) U.S. Cl.
CPC ................. *H05K 9/00* (2013.01); *G21B 1/23* (2013.01); *G21K 5/08* (2013.01); *H05K 9/0081* (2013.01)

(58) Field of Classification Search
CPC ........ H02H 9/005; H02H 9/00; H05K 9/0064; H05K 9/0066; H05K 9/00; G21K 5/08
See application file for complete search history.

(56) References Cited

PUBLICATIONS

J.L. Dubois et al. Target charging in short-pulse-laser-plasma experiments. American Physical Society, Phyisical Revie E89, 013102 (2014), Jan. 13, 2014 [online], [retrieved on Aug. 10, 2017]. Retrieved from the Internet: <URL: https://journals.aps.org/pre/abstract/10.1103/PhysRevE.89.013102>.*

U.S. Appl. No. 14/766,588, filed Aug. 7, 2015, Jean-Lean-Luc Dubois et al.

French Preliminary Search Report issued Aug. 5, 2015 in French Application 14 59941, filed on Oct. 16, 2014 ( with English Translation of Categories of Cited Documents).

(Continued)

*Primary Examiner* — Zeev V Kiton
*Assistant Examiner* — Nicolas Bellido
(74) *Attorney, Agent, or Firm* — Oblon, McClelland, Maier & Neustadt, L.L.P.

(57) ABSTRACT

A device attenuates an electromagnetic pulse generated in an installation in which a high-power laser beam is sent to a target mounted on a target support. The device includes an electrically conductive plate, electrically connected to an electric earth of the installation and to which the target support is fixed, a plate of material which absorbs electromagnetic waves fixed to one face of the electrically conductive plate located on the target support side and a device for passing a discharge current, which is the result of an interaction of the laser beam with the target, between the target and the electrically conductive plate, where the device for passing the discharge current is equipped with a device for attenuating the current.

17 Claims, 4 Drawing Sheets

(56) References Cited

PUBLICATIONS

J. L. Dubois et al. "Target Charging in short-pulse-laser-plasma experiments", Physical Review E, vol. 89, No. 1, 2014, 15 pages.
Vincent G. Harris "Modern Microwave Ferrites", IEEE transactions on Magnetics, vol. 48, No. 3, 2012, 30 pages.
Jim Brown "Understanding How Ferrites Can Prevent and Eliminate RF Interference to Audio Systems" XP055206382, http://audiosystemsgroup.com/SAC0305Ferrites.pdf 2005, 12 pages.

* cited by examiner

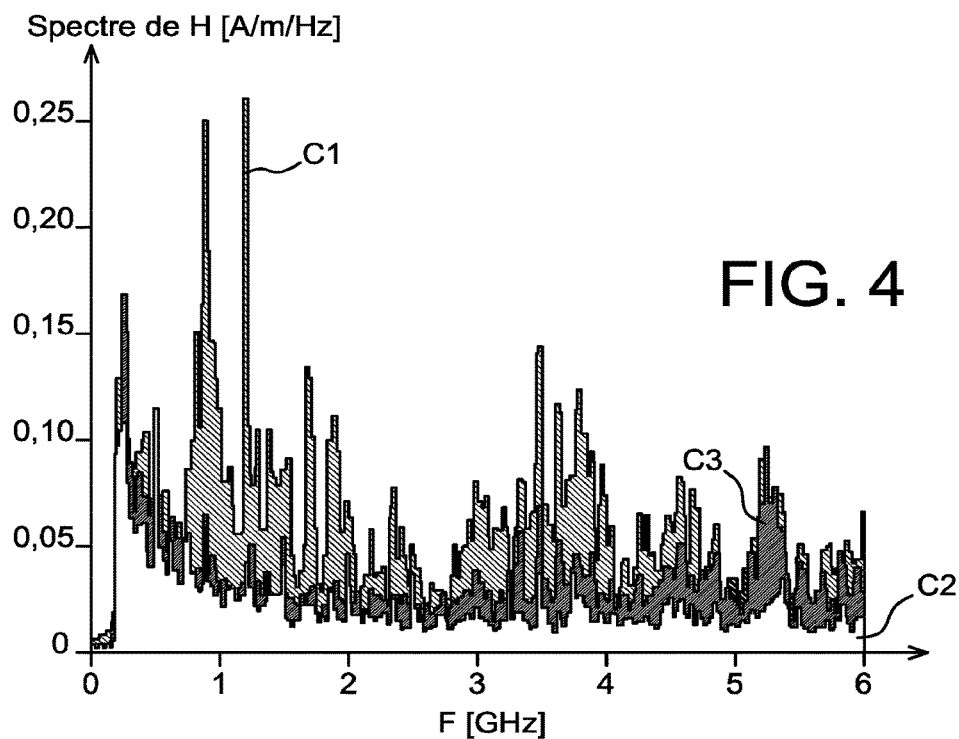
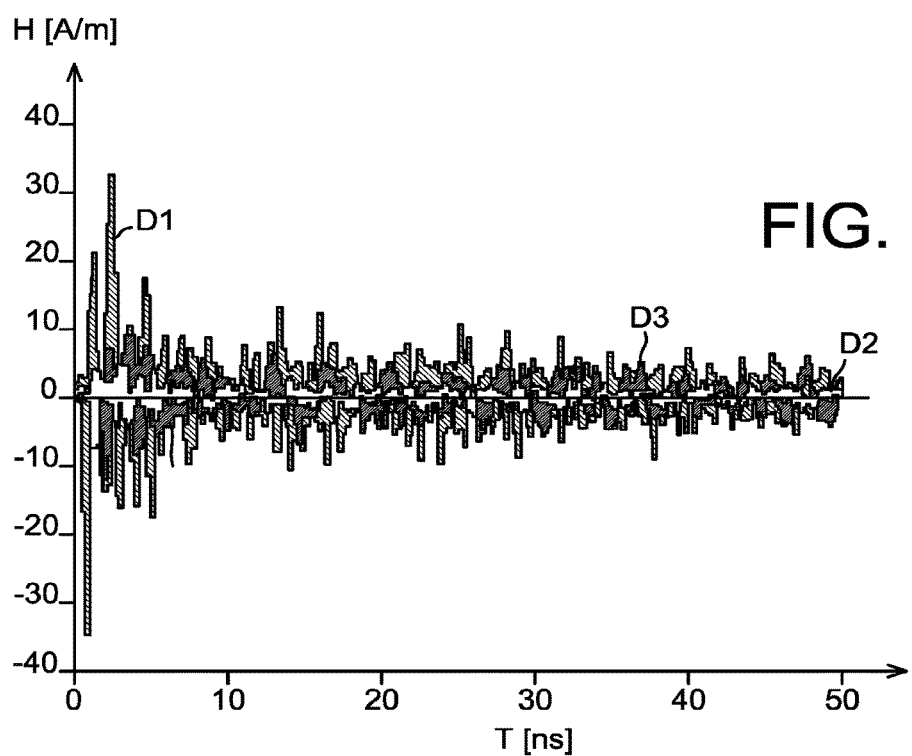

DEVICE FOR ATTENUATING ELECTROMAGNETIC PULSE GENERATED IN A POWER LASER INSTALLATION

TECHNICAL FIELD AND PRIOR ART

The invention relates to a device for attenuating an electromagnetic pulse generated in a power laser installation.

A power laser installation is an installation wherein a high power laser beam is sent to a target. The applications of these high-flow laser experiments relate to the physical investigation of matter subjected to high energy densities, thermonuclear fusion using inertial confinement, generation of high-energy particle beams etc.

The fields of application are, for example, astrophysics, research into new sources of nuclear energy, particle acceleration, research into new radiographic methods etc.

FIG. 1 shows the assembly of a target on a support according to the prior art. A target 1 is placed on a target support 2, with the target support itself being mounted on a target holder 3 placed on an electrically conductive partition 4, for example the floor of the installation, which is connected to the installation's electrical earth. The target support 2 may or may not be electrically conductive. The target holder 3, for example a motorised arm, is electrically conductive. During the interaction of the laser beam with the target, electrons are ejected from the target. The laser chamber and the target are then polarised, with opposite signs. The system formed by the laser chamber and the target return to their state of electrical equilibrium (neutralisation) by the passage of currents. Less electron holes (positive charges) that exist on the target in effect produce a significant discharge current in the target-holder 3 and the target support 2 when the latter is electrically conductive. Furthermore, electrons are also ejected onto the enclosure of the chamber, thus creating a circulating current on the walls of the installation. These circulating currents (in the target-holder, in the target support if the latter is electrically conductive, and on the walls) generate an intense electromagnetic pulse in the micro-wave range and at lower frequency.

This electromagnetic pulse represents a significant constraint upon correct operation of the laser installation. The intensity of the electromagnetic field and associated discharge currents that result from this pulse can, in fact, have an adverse effect on the conduct of experiments (destroying measurement apparatus and equipment in the installation) as well as on the use of these measurements (noise, aberrations, loss of data etc.). The safety of the installation may also be jeopardised by a malfunction or deterioration of the dedicated systems.

Studies show that the electromagnetic pulse amplitude increases with the intensity of the laser beam (see "*Electromagnetic pulse (EMP) issues on short-pulse facilities*" J. Gazave et al., Workshop: Physics with PETAL, Bordeaux 2011). As a consequence, an increase in the power of laser beams is today associated with a worrying deterioration in the electromagnetic environment in installations.

A first known way of protecting equipment from the electromagnetic pulse is, on the one hand, to seal the chamber from an electromagnetic point of view so as to protect the equipment located inside the chamber and, on the other hand, to ensure shielding of each of the items of electronic equipment located inside the chamber. The drawbacks of this protection are the resultant complexity and the cost. In the majority of cases the shielding must be designed at the design phase for the equipment, since subsequent designing of the shielding is often difficult to achieve. Another drawback is that this method of protection does not attenuate the current in the target-holder and consequently does not protect the latter.

A second way of protecting the equipment is divulged in the article "*Assessment and mitigation of electromagnetic pulse (EMP) impacts at short-pulse laser facilities*" C. G. BROWN, D. C. EDER, Journ. Phys., Conf. Serv., vol 244, 032001 (2010). The electromagnetic pulse is attenuated at the source. The attenuation principle involves enclosing the target in a metal shell in order to suppress the ejection of electrons onto the walls of the installation. The shell has holes made in it to allow the laser beam to pass through. This technique attenuates the radiated magnetic field by a factor of about three. One major drawback of this technique is its highly intrusive character, which places significant constraints on the operator when undertaking experiments.

The device according to the invention does not have the above mentioned disadvantages.

ACCOUNT OF THE INVENTION

The invention relates to a device for attenuating an electromagnetic pulse generated in an installation wherein a high-power laser beam is sent to a target mounted on a target support, characterised in that the device comprises an electrically conductive plate, electrically connected to an electric earth of the installation and to which the target support is fixed, a plate of material which absorbs electromagnetic waves fixed to one face of the electrically conductive plate located on the target support side and suitable means for passing a discharge current which is the result of an interaction of the laser beam with the target between the target and the electrically conductive plate, where the suitable means for passing the discharge current are equipped with means for attenuating said current.

In a first embodiment of the invention the target support is electrically conductive. The target support is then formed, for example, of an electrically conductive element, for example a rod, mounted in series with a current limiting resistance and/or an inductance. In another variant of the first embodiment of the invention, the target support is formed of an electrically conductive element surrounded by an element of material which absorbs the magnetic field, where the electrically conductive element, for example a rod, may or may not be mounted in series with a resistance and/or an inductance.

In a second embodiment of the invention the target support is electrically insulating. The suitable means for passing the discharge current are then formed by a diversion branch fixed between the target and the electrically conductive plate. The diversion branch is formed, for example, from an electrically conductive part mounted in series with a current limiting resistance and/or an inductance, a first end of the electrically conductive part being linked to the target and a second end of the electrically conductive part being fixed to the electrically conductive plate, in an opening made in the plate of material which absorbs electromagnetic waves. In another variant of the second embodiment of the invention, the diversion branch is formed of an electrically conductive part surrounded by an element of material which absorbs the magnetic field, where the electrically conductive part may or may not be mounted in series with a resistance and/or an inductance.

According to an additional characteristic of the invention, a plate of electrically insulating material covers a face of the electrically conductive plate located on the side away from the target support.

Advantageously, the device of the invention greatly attenuates both the discharge current and the amplitude of the radiated electromagnetic field, without the need for local protection of the equipment in the installation, without constraints on the characteristics of the target or of the laser beam and without impacting the undertaking of experiments.

BRIEF DESCRIPTION OF THE FIGURES

Other characteristics and advantages of the invention will appear on reading the embodiments given in reference to the attached figures, among which:

FIG. 4 shows the spectrum of the magnetic field present in the installation as a function of the frequency according to the two embodiments of the invention in comparison with the prior art;

FIG. 5 shows the amplitude of the magnetic field present in the installation as a function of time according to the two embodiments of the invention in comparison with the prior art;

In all the figures the same references designate the same elements.

DETAILED ACCOUNT OF THE EMBODIMENTS OF THE INVENTION

Figure 1:
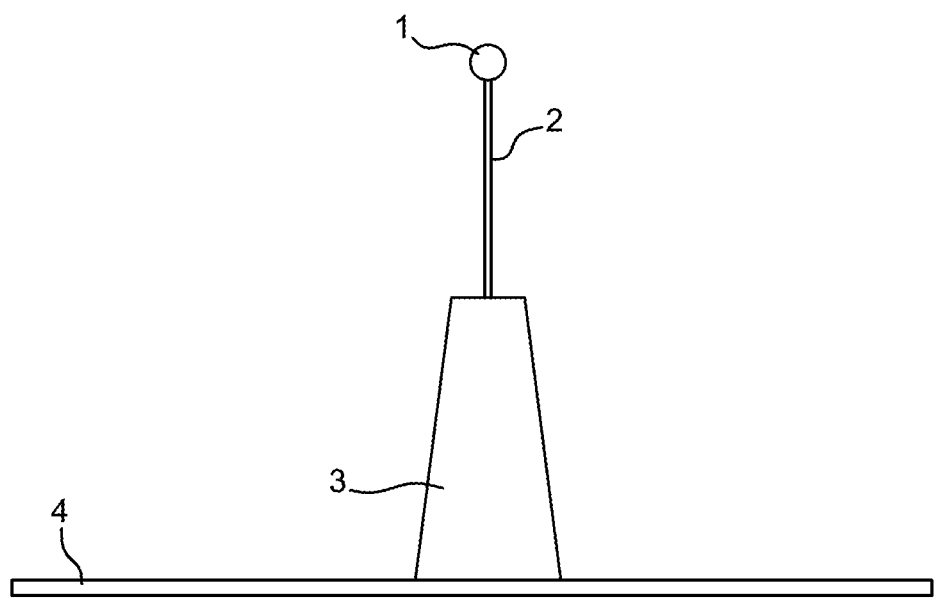
FIG. 1, already described, shows the assembly of a target on its support according to the prior art.
Figure 2:
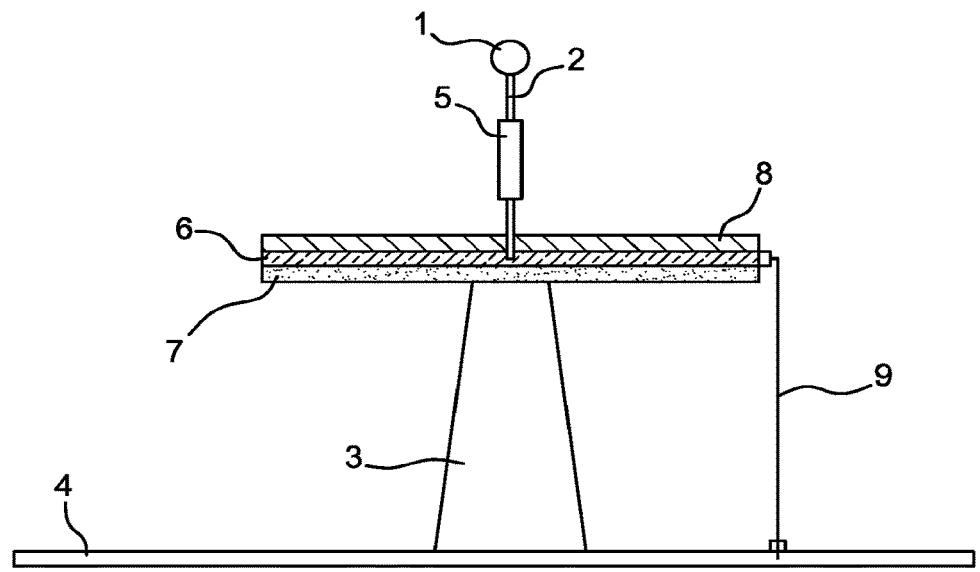
FIG. 2 shows a target equipped with an attenuation device according to a first embodiment of the invention.

FIG. 2 shows a target equipped with an attenuation device according to a first embodiment of the invention.

According to the first embodiment of the invention, the target support 2 is electrically conductive. The attenuation device comprises an electrically conductive plate 6 wherein the target support 2 is fixed, a plate of material that absorbs electromagnetic waves 8 and which covers the face of the electrically conductive plate 6 located on the side of the target support 2 and a means 9 of electrically earthing the electrically conductive plate 6. The discharge current which results from the interaction of the laser beam with the target flows in the target support 2. The target support is equipped with a part 5 which is suitable for attenuating the discharge current. The part 5 is a resistor or an inductance which constitutes a fraction of the target support, or an element of material that absorbs the magnetic field (magnetic absorbent) passing through the target support. The part 5 can also be a combination of all or part of the above-mentioned elements (resistance, inductance, element of material that absorbs the magnetic field).

According to an improvement in the invention (shown in FIG. 2), the attenuation device comprises an electrically insulating plate 7 which covers the face of the electrically conductive plate located on the side away from the target support 2. The electrically insulating plate 7 improves the return of the electric charge passing through the plate 6 to the electrical earth.

The absorbent material making up the plate 8 or the means 5, when the latter is made of such a material, is for example a ferrite.

The target 1 is, for example, a copper disk a few millimeters in diameter. The centre of the target 1 is located a few centimeters from the plate 6. Plates 6, 7 and 8 are of low thickness, for example a few millimeters, and have a side or a diameter equal, for example, to 10 cm.

Figure 3:
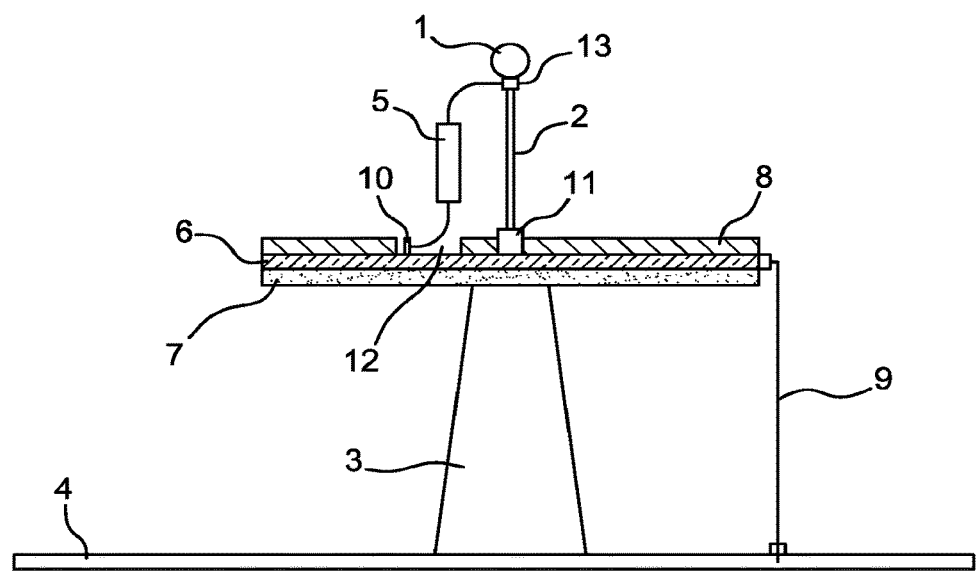
FIG. 3 shows a target equipped with an attenuation device according to a second embodiment of the invention.

FIG. 3 shows a target equipped with an attenuation device according to the second embodiment of the invention.

According to the second embodiment of the invention, the target support 2 is made of an electrically insulating material. The attenuation device also comprises an electrically conductive plate 6 wherein the target support 2 is fixed, for example with an electrically insulating piece 11, a plate of material that absorbs electromagnetic waves 8 which covers the face of the electrically conductive plate 6 located on the side of the target support, a means 9 of electrically earthing the electrically conductive plate 6 and means suitable for causing the discharge current resulting from an interaction of the laser beam with the target, to flow.

The suitable means for causing the discharge current to flow is made up of an electrically conductive piece, or diversion branch, whereof one end is connected to the base of the target 1 by an electrical connection 13 and a second end is fixed to the plate 6 by, for example, an electrical connection 10. The electrical connection 10 is placed in an opening 12 made in the plate of absorbent material 8. The suitable means for causing the discharge current to flow comprises suitable means 5 for attenuating this current such as, for example, a resistance or an inductance which forms part of the diversion branch, or a block of material which absorbs the magnetic field that the diversion branch passes through. Just as in the first embodiment of the invention, the means of attenuation 5 may be a combination of all or part of the previously mentioned elements (resistance, inductance, block of material which absorbs the magnetic field).

In an improvement to the invention (shown in FIG. 3), an electrically insulating plate 7 covers the face of the electrically conductive plate located on the side away from the target support 2. The function of the electrically insulating plate 7 is to improve the return of the electric charge passing in the plate 6 to the electrical earth.

The attenuation device of the invention advantageously allows the currents that pass just after the ejection of charged particles by the target to be retarded, dissipated and attenuated. The use of absorbent materials limits the radiation from these currents.

The earthing plane formed by the conductive plate 6 advantageously confines the source of the electromagnetic pulse near the target. The presence of the conductive plate 6 provides the ability to process the electromagnetic pulse at its source and make it less dependent of the chamber characteristics, that is, primarily, on the geometry of the distribution of the metal elements within the installation. Nevertheless, the distance between the earthing plane and the target is controlled in order to avoid resonance frequency excitation of the enclosure which then acts as a resonant cavity.

In both embodiments of the invention, the means 5 (resistance or inductance or element of magnetic absorbent material) limit the amplitude of the discharge current oscillations which are established between the target 1 and the plate 6. It follows from this that the field radiated by the discharge current is attenuated.

The plate of electromagnetic absorbent material 8 advantageously allows the amplitude of the waves that the plate 6 reflects to be reduced and in particular the first electromagnetic pulse wave front, which is the most intense wave front. The electromagnetic properties of the electromagnetic absorbent material as well as the thickness of this material are selected such that the electromagnetic absorption occurs at the principal frequencies of the electromagnetic pulse. As has already been mentioned earlier, the material is, for example, a ferrite with a thickness of a few millimeters, for example 3 mm.

FIG. 4 shows, by way of a non-restrictive example, the spectrum of the magnetic field H measured under identical laser firing conditions (beam and target), as a function of the frequency F according to the two embodiments of the invention in comparison with the prior art.

The values taken by the elements 6 and 8 which contribute to the attenuation of the electromagnetic pulse are identical for both embodiments of the invention. For the first embodiment, the element 5 corresponds to the use of a ferrite material around the target support 2. In the second embodiment, the element 5 corresponds to the use of a resistance in series of value 5 kΩ. The curve C1 represents the spectrum of the magnetic field according to the prior art and curves C2 and C3 represent the spectrum of the magnetic field according to the first embodiment of the invention and according to the second embodiment of the invention respectively. It will be observed that the electromagnetic pulse is significantly attenuated with the aid of the attenuation devices of the invention, with the attenuation being greater according to the first embodiment of the invention than according to the second embodiment.

FIG. 5 shows the amplitude of the magnetic field H measured in the installation as a function of time T according to the two embodiments of the invention in comparison with the prior art, under the conditions described earlier.

The curve D1 represents the amplitude of the magnetic field as a function of time according to the prior art and curves D2 and D3 represent the amplitude of the magnetic field as a function of time according to the first embodiment of the invention and according to the second embodiment of the invention respectively. Advantageously it will be observed that the amplitude of the magnetic field is greatly attenuated as a result of the attenuation device of the invention, primarily when the pulse occurs.

Figure 6:
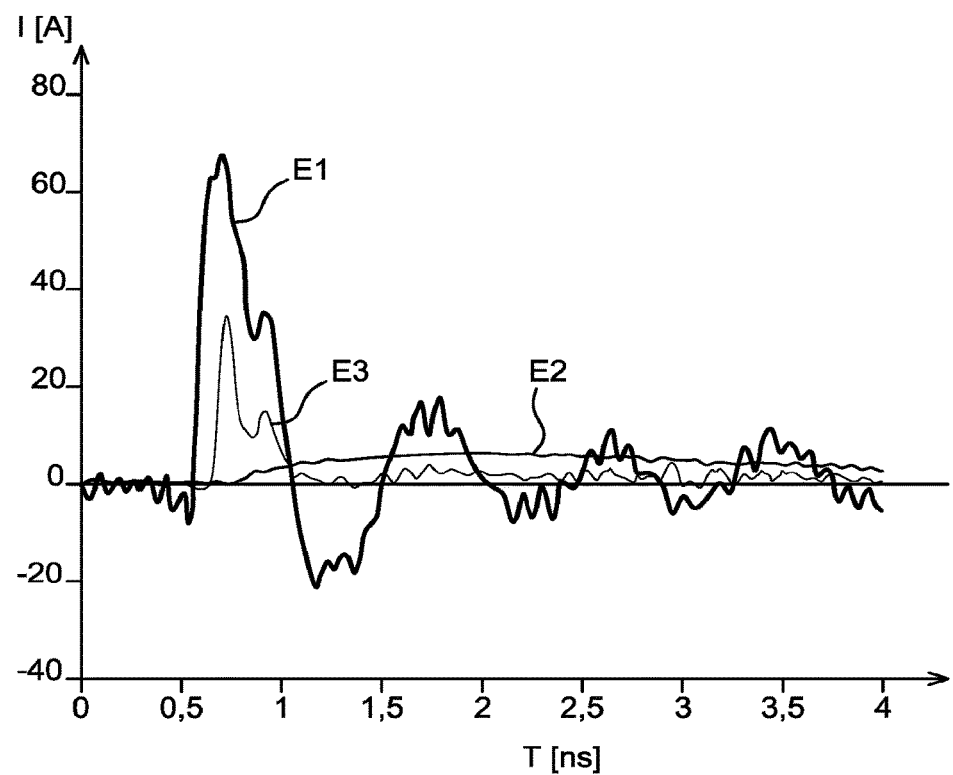
FIG. 6 shows the discharge current intensity as a function of time according to the two embodiments of the invention in comparison with the prior art.

FIG. 6 shows the intensity I of the discharge current I measured as a function of the time T according to the two embodiments of the invention in comparison with the prior art, under the conditions described earlier. The curve E1 represents the current intensity according to the prior art and curves E2 and E3 represent the intensity of the current according to the first embodiment of the invention and according to the second embodiment of the invention respectively.

A clear attenuation of the discharge current is observed with the attenuation device of the first embodiment of the invention (curve E2), with the attenuation device of the second embodiment (curve E3) exhibiting a lesser attenuation. It should nevertheless be noted that modifying all or part of the values of the elements which make up the attenuation device according to the second embodiment of the invention, for example an increase in the value of the resistance in the case of means 5 being a resistance, allows the results of the second embodiment of the invention to be improved.

The invention claimed is:

1. A device for attenuating an electromagnetic pulse generated in an installation wherein a high-power laser beam is sent to a target mounted on a target support, comprising:
an electrically conductive plate, electrically connected to an electrical earth of the installation and to which the target support is fixed;
a plate of material which absorbs electromagnetic waves fixed to one face of the electrically conductive plate located on the target support side; and
means for passing a discharge current which is the result of an interaction of the laser beam with the target between the target and the electrically conductive plate, wherein the means for passing the discharge current are equipped with means for attenuating said current.

2. The device according to claim 1, wherein the means for passing the discharge current comprise an electrically conductive element mounted in series with a current limiting resistance, wherein the electrically conductive element mounted in series with the current limiting resistance constitutes the target support.

3. The device according to claim 1, wherein the means for passing the discharge current comprise an electrically conductive element mounted in series with an inductance, wherein the electrically conductive element mounted in series with the inductance constitutes the target support.

4. The device according to claim 1, wherein the means for passing the discharge current are made up of an electrically conductive element and the means for attenuating the current are made up of an element of material which absorbs a magnetic field which surrounds the electrically conductive element, wherein the electrically conductive element surrounded by the material which absorbs the magnetic field forms the target support.

5. The device according to claim 1, wherein the means for passing the discharge current are made up of an electrically conductive element mounted in series with a current limiting resistance and with an inductance, wherein the electrically conductive element mounted in series with the resistance and the inductance constitutes the target support.

6. The device according to claim 5, wherein an element of material which absorbs a magnetic field surrounds the electrically conductive element.

7. The device according to claim 1, wherein the target support is made of an electrically insulating material and the means for passing the discharge current comprise an electrically conductive part mounted in series with a current limiting resistance, a first end of the electrically conductive part being linked to the target and a second end of the electrically conductive part being fixed to the electrically conductive plate, in an opening made in the plate of material which absorbs electromagnetic waves.

8. The device according to claim 1, wherein the target support is made of an electrically insulating material and the means for passing the discharge current comprise an electrically conductive part mounted in series with an inductance, a first end of the electrically conductive part being linked to the target and a second end of the electrically conductive part being fixed to the electrically conductive plate, in an opening made in the plate of material which absorbs electromagnetic waves.

9. The device according to claim 1, wherein the target support is made of an electrically insulating material, the means for passing the discharge current comprise an electrically conductive part, a first end of the electrically conductive part being linked to the target and a second end of the electrically conductive part being fixed to the electrically conductive plate, in an opening made in the plate of material which absorbs electromagnetic waves and the means for attenuating the current are made up of an element of material which absorbs a magnetic field which surrounds the electrically conductive part.

10. The device according to claim 1, wherein the target support is made of an electrically insulating material and the means for passing the discharge current comprise an electrically conductive part mounted in series with a current limiting resistance and an inductance, a first end of the electrically conductive part being linked to the target and a second end of the electrically conductive part being fixed to the electrically conductive plate, in an opening made in the plate of material which absorbs electromagnetic waves.

11. The device according to claim 10, wherein an element of material which absorbs a magnetic field surrounds the electrically conductive part.

12. The device according to claim 1, wherein the material which absorbs the electromagnetic waves is a ferrite.

13. The device according to claim 4, wherein the material which absorbs the magnetic field is a ferrite.

14. The device according to claim 6, wherein the material which absorbs the magnetic field is a ferrite.

15. The device according to claim 9, wherein the material which absorbs the magnetic field is a ferrite.

16. The device according to claim 11, wherein the material which absorbs the magnetic field is a ferrite.

17. The device according to claim 1, wherein a plate of electrically insulating material covers a face of the electrically conductive plate located on the side opposite the target support.

* * * * *